United States Patent
Suzuki et al.

(10) Patent No.: US 10,461,119 B2
(45) Date of Patent: Oct. 29, 2019

(54) SOLID-STATE IMAGING DEVICE, IMAGING SYSTEM, AND METHOD FOR MANUFACTURING SOLID-STATE IMAGING DEVICE

(71) Applicant: CANON KABUSHIKI KAISHA, Tokyo (JP)

(72) Inventors: Sho Suzuki, Yokohama (JP); Kentaro Suzuki, Kawasaki (JP); Takashi Okagawa, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 182 days.

(21) Appl. No.: 15/807,320

(22) Filed: Nov. 8, 2017

(65) Prior Publication Data

US 2018/0138234 A1 May 17, 2018

(30) Foreign Application Priority Data

Nov. 17, 2016 (JP) .................. 2016-224382

(51) Int. Cl.
*H01L 27/146* (2006.01)
*H01L 27/148* (2006.01)
*H01L 21/8238* (2006.01)

(52) U.S. Cl.
CPC .... *H01L 27/14818* (2013.01); *H01L 21/8238* (2013.01); *H01L 27/14623* (2013.01)

(58) Field of Classification Search
CPC ................................................ H01L 27/14623
See application file for complete search history.

(56) References Cited

U.S. PATENT DOCUMENTS

| 7,830,433 | B2 | 11/2010 | Fujioka et al. |
| 8,284,283 | B2 | 10/2012 | Fujioka et al. |
| 8,835,991 | B2 | 9/2014 | Arakawa |
| 9,300,891 | B2 | 3/2016 | Isono et al. |
| 2012/0104523 | A1* | 5/2012 | Ikeda ............... H01L 27/14607 257/432 |

FOREIGN PATENT DOCUMENTS

JP 2014-22421 A 2/2014

* cited by examiner

*Primary Examiner* — Thanh Luu
(74) *Attorney, Agent, or Firm* — Canon U.S.A., Inc. I.P. Division

(57) ABSTRACT

A solid-state imaging device includes a light-shielding layer that is disposed in a pixel region containing a pixel including a photoelectric conversion element and a charge holding portion and a peripheral region in which a signal from the pixel is processed and that is electrically connected to a substrate at a contact portion in the peripheral region, a first insulating layer that has an end portion between the charge holding portion and the contact portion in plan view and that is disposed between the substrate and the light-shielding layer, and a first insulating member that is disposed on a side surface of the end portion of the first insulating layer and that buffers a step due to the end portion. A portion of the light-shielding layer overlapping the first insulating member in the plan view has an upper surface having a shape following a shape of the first insulating member.

20 Claims, 9 Drawing Sheets

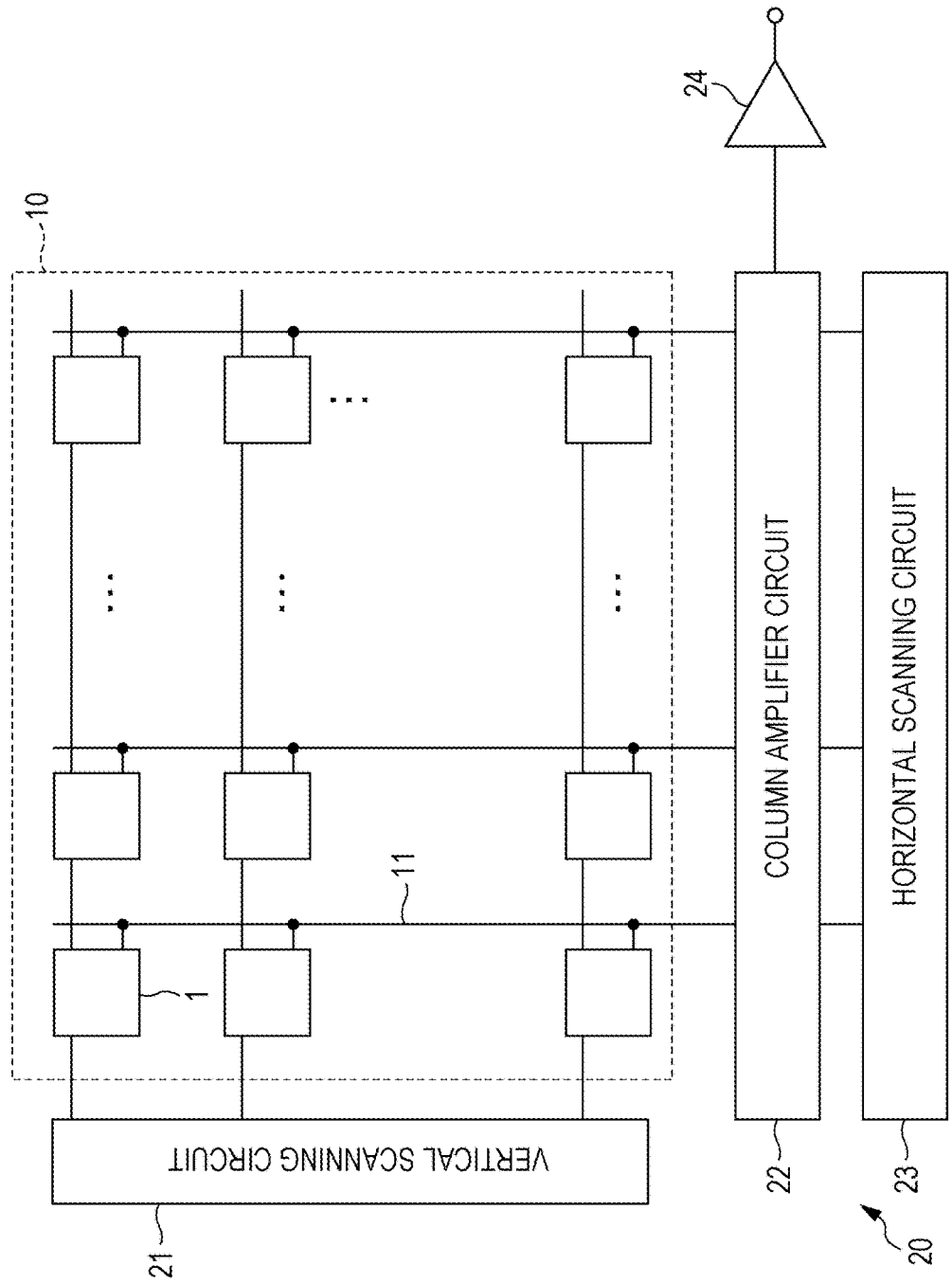

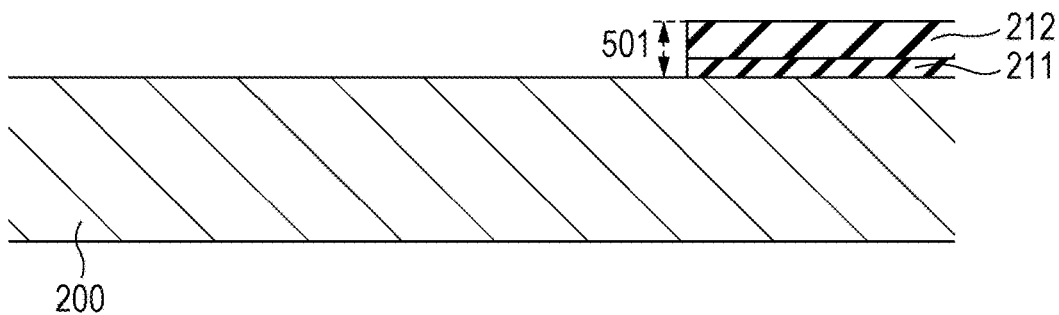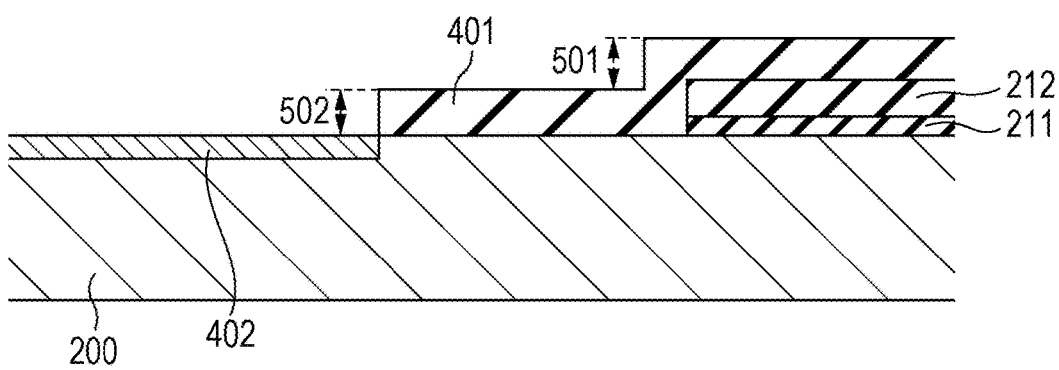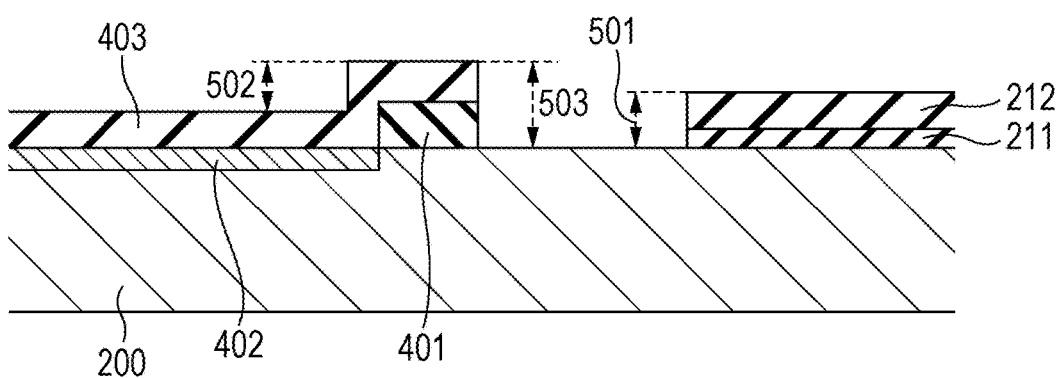

SOLID-STATE IMAGING DEVICE, IMAGING SYSTEM, AND METHOD FOR MANUFACTURING SOLID-STATE IMAGING DEVICE

BACKGROUND OF THE INVENTION

Field of the Invention

The present disclosure relates to one or more embodiments of a solid-state imaging device, an imaging system, and a method for manufacturing the solid-state imaging device.

Description of the Related Art

It has been proposed that active pixel type solid-state imaging devices represented by CMOS image sensors have a global electronic shutter function.

A solid-state imaging device having a global electronic shutter function includes a light-receiving portion for photoelectric conversion and a charge holding portion that holds a charge generated by photoelectric conversion at the light-receiving portion. At this time, there is a risk that photoelectric conversion of light incident on the charge holding portion causes a noise signal, which degrades an image. Accordingly, it is necessary for the charge holding portion to be covered by a light-shielding layer to prevent light to be incident.

It is preferable that the electric potential of the light-shielding layer be not floating but controlled. In Japanese Patent Laid-Open No. 2014-22421, the light-shielding layer is connected to a gate electrode or an upper-layer wiring line, and the electric potential of the light-shielding layer is controlled through the connection.

SUMMARY OF THE INVENTION

The present disclosure provides at least one embodiment of a solid-state imaging device including a pixel including a photoelectric conversion element and a charge holding portion to which a charge generated by the photoelectric conversion element is transferred in a pixel region, a peripheral circuit that processes a signal from the pixel in a peripheral region, a light-shielding layer that is disposed in the pixel region and the peripheral region and that is electrically connected to a substrate at a contact portion in the peripheral region, a first insulating layer that has a side surface between the charge holding portion and the contact portion in a plan view and that is disposed between the substrate and the light-shielding layer in a section perpendicular to a plane of the plan view, and a first insulating member that is disposed on the side surface of the first insulating layer. An angle formed between an upper surface of the first insulating layer and a side surface of the first insulating member is larger than an angle formed between the upper surface of the first insulating layer and the side surface of the first insulating layer. A portion of the light-shielding layer that overlaps the first insulating member in the plan view has an upper surface having a shape following a shape of the first insulating member.

The present disclosure provides at least one embodiment of a solid-state imaging device including a pixel region containing a pixel including a photoelectric conversion element and a charge holding portion to which a charge generated by the photoelectric conversion element is transferred, a peripheral region in which a peripheral circuit that processes a signal from the pixel is disposed, a light-shielding layer that is disposed in the pixel region and the peripheral region and that is electrically connected to a substrate at a contact portion in the peripheral region, a first insulating layer that has an end portion between the charge holding portion and the contact portion in a plan view and that is disposed between the substrate and the light-shielding layer in a section perpendicular to a plane of the plan view, and a first insulating member that is disposed on a side surface of the end portion of the first insulating layer and that buffers a step due to the end portion. A portion of the light-shielding layer that overlaps the first insulating member in the plan view has an upper surface having a shape following a shape of the first insulating member.

The present disclosure provides at least one embodiment of a method for manufacturing a solid-state imaging device, the method including forming a first insulating film on a substrate having a pixel region containing a semiconductor region of a photoelectric conversion element, a semiconductor region of a charge holding portion, and a gate electrode of a transistor and a peripheral region containing a gate electrode of a transistor, removing a part of the first insulating film to form a first insulating layer, forming, on a side surface of an end portion of the first insulating layer that is formed by removing the part of the first insulating film, an insulating member that buffers a step due to the end portion, and forming a light-shielding layer that covers the semiconductor region of the charge holding portion, the end portion of the first insulating layer, and the insulating member and that is to be electrically connected to the substrate in the peripheral region. A portion of the light-shielding layer that overlaps the insulating member in a plan view has an upper surface having a shape following a shape of the insulating member.

According to other aspects of the present disclosure, one or more additional solid-state imaging devices, one or more imaging systems, and one or more methods for manufacturing solid-state imaging devices are discussed herein. Further features of the present disclosure will become apparent from the following description of exemplary embodiments with reference to the attached drawings.

BRIEF DESCRIPTION OF THE DRAWINGS

FIG. 1 is a block diagram of a part of a solid-state imaging device according to at least a first embodiment.

FIGS. 7A to 7C are sectional diagrams illustrating a method for manufacturing a solid-state imaging device according to at least a second embodiment.

DESCRIPTION OF THE EMBODIMENTS

Figure 2A:
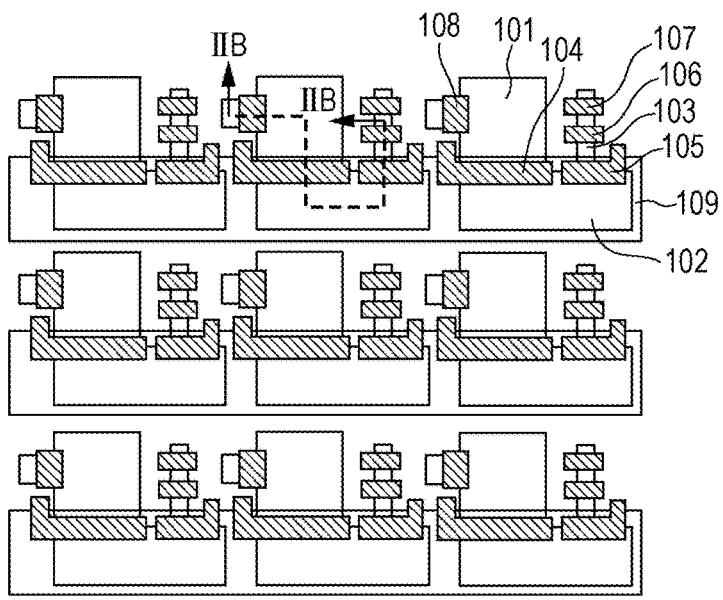
FIG. 2A is a plan view of a part of a pixel region of the solid-state imaging device according to at least the first embodiment.

In at least one embodiment of a solid-state imaging element including a light-shielding layer, the electric potential of the light-shielding layer can be controlled in a manner in which a joint between the light-shielding layer and a substrate is formed in a peripheral region. However, the presence or absence of an optical antireflection structure or the presence or absence of a metal silicide region differs between a pixel region and the peripheral region. The number of insulating films used for forming these also differs. In some cases, an end portion of an insulating film is disposed between the substrate and the light-shielding layer, and a step is formed due to the end portion of the insulating film. There is a possibility that the step reduces the thickness of the light-shielding layer or causes disconnection thereof, and that a failure of conduction of the light-shielding layer occurs.

First Embodiment

A solid-state imaging device according to at least a first embodiment of the present disclosure and a method for manufacturing the solid-state imaging device will be described with reference to the drawings. FIG. 1 is a block diagram of a part of the solid-state imaging device according to at least the first embodiment. The solid-state imaging device includes a pixel region 10 containing pixels 1 arranged in a matrix form and a peripheral region 20 located near the pixel region, and peripheral circuits are disposed in the peripheral region 20.

For example, each pixel 1 includes a photoelectric converter including a photoelectric conversion element for photoelectric conversion and a readout portion for readout of a charge. The readout portion includes a charge holding portion to which a charge generated by the photoelectric conversion element is transferred, a transfer transistor that transfers the charge generated by the photoelectric conversion element to the charge holding portion, and a transfer transistor that transfers the charge held by the charge holding portion. The readout portion also includes a reset transistor that resets a charge-voltage converter, an amplifying transistor that outputs a signal corresponding to the electric potential of the charge-voltage converter, and a transistor for selecting the amplifying transistor.

The pixel region 10 can contain an optical black pixel including a photoelectric conversion element from which light is shielded and a pixel that includes no photoelectric conversion element and that does not output an image such as a dummy pixel other than effective pixels.

The peripheral region 20 contains peripheral circuits such as a vertical scanning circuit 21, a column amplifier circuit 22, a horizontal scanning circuit 23, and an output unit 24. The vertical scanning circuit 21 provides control signals for switching on (conducting state) or off (non-conducting state) the transistors of each pixel 1. Vertical signal lines 11 are arranged in columns of the pixels 1 and read signals from the pixels 1 in the columns. The column amplifier circuit 22 includes a differential amplifier circuit and a sample and hold circuit, and the column amplifier circuit 22 amplifies pixel signals outputted to the vertical signal lines 11.

The horizontal scanning circuit 23 provides switches connected to amplifiers in the columns and control signals for switching on or off the switches. The output unit 24 is formed of, for example, a buffer amplifier and a differential amplifier and outputs the pixel signals from the column amplifier circuit 22 to a signal processing unit outside the solid-state imaging device. The signal processing unit performs analog-digital conversion of the outputted pixel signals and correction of input data thereof. The solid-state imaging device may be a digital sensor having an analog-digital conversion function.

Figure 2B:
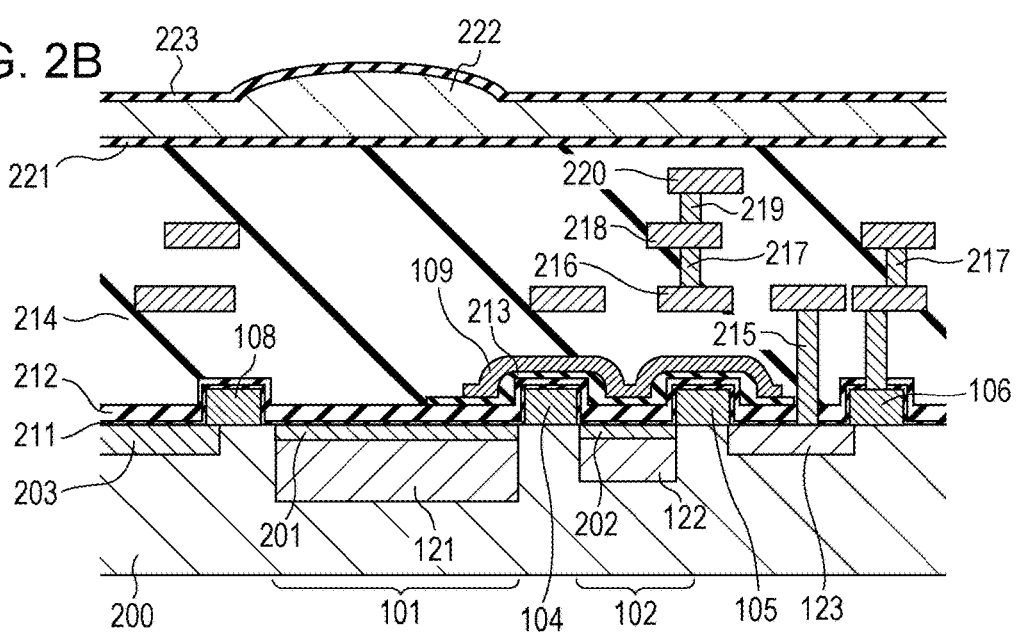
FIG. 2B is a schematic sectional view of the solid-state imaging device taken along line IIB-IIB in FIG. 2A.
Figure 2C:
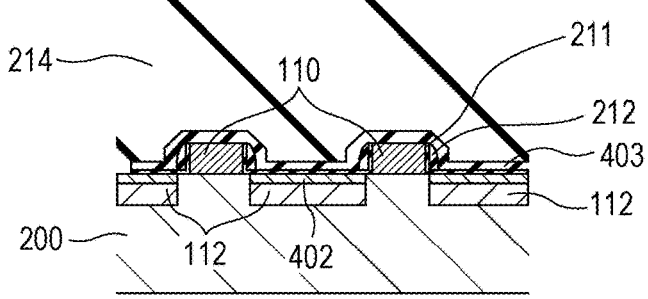
FIG. 2C is a schematic sectional view of a part of a peripheral region.

FIGS. 2A to 2C illustrate an example of a part of the pixel region and a part of the peripheral region of the solid-state imaging element according to at least the first embodiment of the present disclosure. FIG. 2A is a plan view of the part of the pixel region of the solid-state imaging device. FIG. 2B is a schematic sectional view of the solid-state imaging device taken along line IIB-IIB in FIG. 2A. FIG. 2C is a schematic sectional view of the part of the peripheral region. In the figures, like components are designated by like symbols. The description herein includes a case where the charge generated by the photoelectric conversion element is an electron. However, the charge generated may be a hole. In this case, the conductivity type of the elements and regions is reversed.

FIG. 2A illustrates an example in which the pixels 1 are arranged in 3 rows and 3 columns. However, the structure according to the present invention is not limited thereto. For example, each pixel 1 includes a photoelectric conversion element 101, a charge holding portion 102, a floating diffusion portion (referred to below as an FD portion) 103, two transfer transistors, and a source follower (referred to below as SF) transistor. The pixel 1 also includes the reset transistor and an overflow drain (referred to below as OFD) transistor.

The transfer transistor that transfers the charge from the photoelectric conversion element 101 to the charge holding portion 102 includes a gate electrode 104. The transfer transistor that transfers the charge from the charge holding portion to the FD portion includes a gate electrode 105. The reset transistor connected to the FD portion includes a gate electrode 106. The SF transistor that converts the charge of the FD portion into voltage includes a gate electrode 107.

The OFD transistor includes a gate electrode 108. A light-shielding layer 109 covers the charge holding portion 102 and is disposed so as to be connected to the substrate in the peripheral region. The light-shielding layer 109 may be continuously formed over the pixels 1 so as to be connected to the substrate in the peripheral region. Examples of the substrate may include a semiconductor substrate such as a silicon substrate 200.

In FIG. 2B, the photoelectric conversion element 101 includes, for example, an n-type semiconductor region 121 located in the silicon substrate 200 and a portion that forms a PN junction together with the n-type semiconductor region 121 and that is a part of a p-type well region of the silicon substrate 200. For example, a p-type semiconductor region 201 may be disposed on the n-type semiconductor region 121, and the photoelectric conversion element may have an embedded type photodiode structure. This structure reduces a noise made at a surface of the silicon substrate.

The charge holding portion 102 includes, for example, an n-type semiconductor region 122 as in the photoelectric conversion element 101. For example, a p-type semiconductor region 202 may be disposed on the n-type semiconductor region 122 to form an embedded structure.

The charge stored at the charge holding portion 102 is transferred to the FD portion 103 in a manner in which the gate electrode 105 of the transfer transistor is caused to have on-potential. The FD portion 103 functions as a charge-voltage converter and includes an n-type semiconductor region 123. The n-type semiconductor region 123 is connected to the gate electrode 107 of the SF transistor with a contact 215 and a wiring line 216 interposed therebetween. With such a structure, the charge transferred to the FD portion 103 is converted into a voltage signal in accordance with the capacity of the n-type semiconductor region 123, the contact 215, and the wiring line 216.

An OFD portion 203 is disposed adjacent to the photoelectric conversion element 101. When the gate electrode 108 of the OFD transistor is caused to have on-potential, the charge stored at the photoelectric conversion element 101 is discharged to the OFD portion 203. In all the pixels, preferably in at least one embodiment, the charge is discharged to the OFD portion 203 at the same time. Subsequently, in all the pixels, the gate electrode 108 is caused to have off-potential at the same time, in one or more embodiments, to start storage of the charge at the same time.

After a predetermined period of time elapses, the charge stored at the photoelectric conversion element 101 in all the pixels is transferred to the charge holding portion 102 at the same time in at least one embodiment. This achieves an electronic shutter that sets a simultaneous and constant exposure time in all the pixels. This reduces a lag of exposure timing due to sequential readout of the charge from the pixels and reduces distortion of an image.

Each pixel includes an antireflection film that overlaps the semiconductor region 121 in a plan view on the photoelectric conversion element 101. The antireflection film includes an insulating film and can be a multilayer of, for example, an insulating layer 211 formed of a silicon oxide film (SiO) and an insulating layer 212 formed of a silicon nitride film (SiN). The light-shielding layer 109 serves as a light-shielding portion covering the charge holding portion 102 with an insulating layer 213, which functions as a close-contact layer, interposed therebetween.

The light-shielding layer 109 inhibits light from being incident on the charge holding portion 102; that is, the light-shielding layer 109 reduces the occurrence of a noise due to a charge generated by incident light at the charge holding portion 102. The plan view is of a plane parallel to a surface of the silicon substrate 200 on which the photoelectric conversion element 101 is formed, and here means a plan view of a plane parallel to a surface of the semiconductor region 201.

In the pixel region, the light-shielding layer 109 is disposed so as to surround at least the charge holding portion 102, a part of the gate electrode 104, and a part of the gate electrode 105. In other words, the light-shielding layer 109 is disposed so as to overlap at least the charge holding portion 102, a part of the gate electrode 104, and a part of the gate electrode 105 in a plan view. It is necessary for the photoelectric conversion element 101 to be irradiated with light, and accordingly, the light-shielding layer 109 has an opening in a portion that overlaps the photoelectric conversion element 101 in a plan view. However, the light-shielding layer 109 may extend partially from a region that overlaps the semiconductor region 122 of the charge holding portion 102 to a region that overlaps an end portion of the photoelectric conversion element 101 in a plan view.

The plan view may be a plan view of a plane parallel to a surface of the semiconductor region 201 or may be a plan view of a plane parallel to a surface of a portion of the silicon substrate 200 at which the charge holding portion 102 is formed, that is, a surface of the semiconductor region 202.

The light-shielding layer 109 can be formed of a film of a material through which visible light is unlikely to pass, such as tungsten, tungsten silicide, tungsten oxide, aluminum, or alloy thereof, or a multilayer thereof. The film thickness of the light-shielding layer 109 can be, for example, 100 to 200 nm. The insulating layer 213, as a close-contact layer, may be a silicon oxide film. The insulating layer 213 is not limited to a layer that functions as a close-contact layer and may be formed of any insulating material. The light-shielding layer 109 is formed as a whole at portions at which the gate electrodes are disposed and portions at which no gate electrodes are disposed, and may have irregularities due to the film thickness of the gate electrodes.

An interlayer insulating film 214, wiring lines 216, 218, and 220, for example, for signal transmission, the contact 215, and vias 217 and 219 are disposed above the silicon substrate 200. Examples of the wiring lines 216, 218, and 220 include an aluminum film, a copper film, and a film of alloy thereof. Examples of the contact 215 and the vias 217 and 219 include a metal film such as a tungsten film, a titanium nitride film, and a titanium film, and a multilayer thereof.

Each pixel 1 may also include an interlayer lens 222 as an optic disposed right above the photoelectric conversion element 101. The interlayer lens 222 is formed of, for example, a silicon nitride film. An antireflection film 221 formed of, for example, a silicon oxynitride film (SiON) may be disposed between the interlayer insulating film 214 and the interlayer lens 222. An antireflection film 223 formed of a silicon oxynitride film may be disposed on the interlayer lens. With such an antireflection structure, the transmittance of incident light is improved, and hence, sensitivity can be improved. A color filter or a micro lens, not illustrated, may be disposed above the interlayer lens 222.

FIG. 2C is a sectional view of transistors, which form parts of the peripheral circuits in the peripheral region. In FIG. 2C, n-type transistors are illustrated as an example. In the silicon substrate 200, n-type semiconductor regions 112 of the transistors are formed. Metal silicide regions 402 are formed on the semiconductor regions 112. Side walls are disposed on side surfaces of gate electrodes 110 of the transistors. The side walls are formed in a manner in which the insulating layer 211 and the insulating layer 212, which are formed of insulating films that function as antireflection films in the pixel region, are etched.

The side walls can be formed, for example, by etch back after a silicon oxide film that is to be the insulating layer 211 and a silicon nitride film that is to be the insulating layer 212 are formed over the pixel region and the peripheral region of the substrate 200.

An insulating layer 403 and the interlayer insulating film 214 are disposed above the silicon substrate 200 including the gate electrodes 110 and the side walls. The insulating layer 403 can be used as an etching stop film when an opening for contact is formed in the interlayer insulating film 214 and can be formed of, for example, a silicon nitride film. The interlayer insulating film 214 can be formed of a silicon oxide film by using plasma chemical vapor deposition (CVD). The materials of these are not limited thereto and may be selected such that the etching rate of the interlayer insulating film 214 is higher than the etching rate of the insulating layer 403.

Figure 3A:
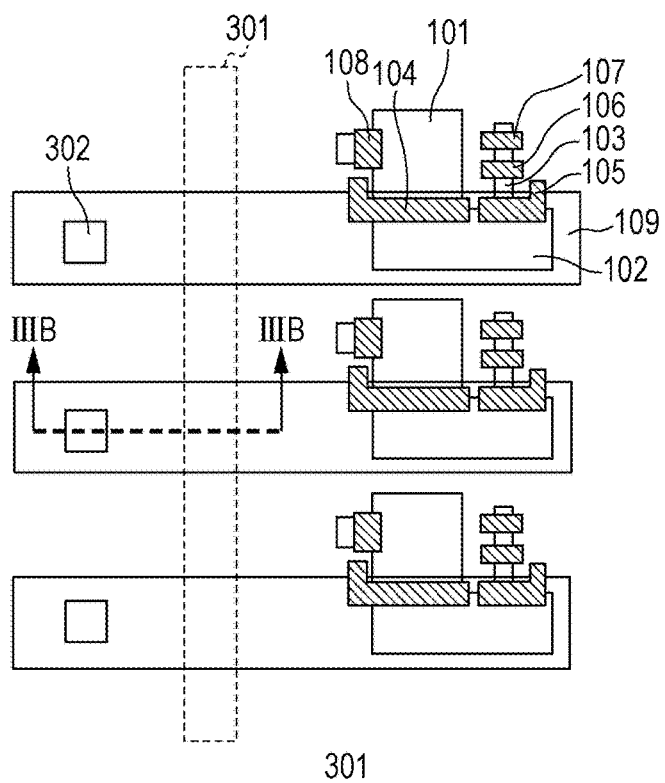
FIG. 3A is a plan view of a part of the solid-state imaging device according to at least the first embodiment.
Figure 3B:
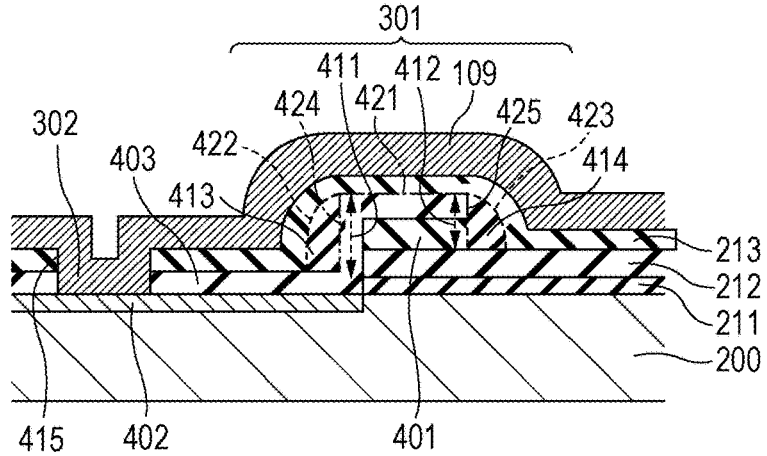
FIG. 3B is a sectional view of the solid-state imaging device taken along line IIIB-IIIB in FIG. 3A.

FIG. 3A is a plan view of the solid-state imaging device according to at least the first embodiment from one of the pixels 1 to a part of the peripheral region near a contact portion between the light-shielding layer 109 and the silicon substrate. FIG. 3B is a sectional view of the solid-state imaging device taken along line IIIB-IIIB in FIG. 3A.

The light-shielding layer 109 is disposed in the pixel region and the peripheral region and is electrically connected to the silicon substrate 200 at a contact portion 302 in the peripheral region. Side surfaces of insulating layers forming a step portion 301 due to insulating films, are located between the charge holding portion 102 of the pixel 1 in the pixel region and the contact portion 302 in the peripheral region in a plan view. The light-shielding layer 109 extends from a portion that overlaps the charge holding portion in a plan view across the step portion 301 and is electrically connected to the silicon substrate 200 at the contact portion 302 in the peripheral region. The electric potential of the light-shielding layer 109 can be controlled in a manner in which the electric potential of the silicon substrate 200 is controlled and the contact portion 302 is interposed.

Accordingly, an electric potential is applied from the substrate 200 to the light-shielding layer 109 and the electric potential of the light-shielding layer 109 can be a fixed value. The photoelectric conversion element 101, the charge holding portion 102, and the well region can be inhibited from being affected by wiring lines in a manner in which the light-shielding layer 109 having a fixed electric potential is disposed between the wiring lines and the photoelectric conversion element 101, the charge holding portion 102, and the well region of the substrate 200. The reason is that the light-shielding layer 109 having a fixed electric potential functions as a shield, which inhibits the electric potential of the charge holding portion 102 and the well region from varying due to coupling between the wiring lines and the photoelectric conversion element 101, the charge holding portion 102, and the well region.

A ground potential or another potential may be applied to the light-shielding layer 109. For example, a negative potential may be applied to enhance the embedded structure of the charge holding portion 102. An auxiliary wiring line may be used to reduce the impedance of the wiring lines in the pixel region.

According to at least the first embodiment, each light-shielding layer 109 is independent from each other in a corresponding column but may be continuous in the pixel region or in the peripheral region. For example, the light-shielding layer 109 may cover the entire pixel region, and an opening may be formed in a portion that overlaps the photoelectric conversion element 101 in a plan view.

In FIG. 3B, the insulating layer 211 and the insulating layer 212, which function as antireflection films, and the insulating layer 213, which is formed of a silicon oxide film and functions as a close-contact layer, are disposed nearer than the step portion 301 to the pixel. The insulating layer 213, which is in contact with the insulating layer 212 and formed on the insulating layer 212, has a refractive index that differs from the refractive index of the insulating layer 212. The insulating layer 211, the insulating layer 212, and the insulating layer 213 can be formed of, for example, a silicon oxide film, a silicon nitride film, and a silicon oxide film, respectively.

At locations nearer than the step portion 301 to the peripheral circuits, each metal silicide region 402 is formed on a surface side (side on which the gate electrodes, for example, are disposed) of the silicon substrate 200, the insulating layer 403, which is formed of a silicon nitride film, is disposed thereon, and the insulating layer 213, which is formed of a silicon oxide film, is disposed thereon.

Each metal silicide region 402 may be formed in the peripheral region at which the contact portion 302 between the silicon substrate 200 and the light-shielding layer 109 is formed. Contact resistance between the light-shielding layer 109 and the silicon substrate 200 can be reduced by using metal silicide.

At the step portion 301, the insulating layer 211, the insulating layer 212, an insulating layer 401, the insulating layer 403, and the insulating layer 213 are disposed, and a step 411 and a step 412 are formed by etching insulating films. In FIG. 3B, at the step portion 301, the insulating layers 211 and 212, which extend from the photoelectric conversion element 101, each have an end portion. An end portion of the insulating layer 401 is aligned with the end portions of the insulating layers 211 and 212. The insulating layer 403 formed on the insulating layer 401 has the step 411 due to the end portions of the insulating layers 211, 212, and 401.

In FIG. 3B, the insulating layer 403, which extends from the contact portion 302 in the peripheral region and is disposed on the insulating layer 401, has an end portion at the step portion 301. The end portion of the insulating layer 403 is aligned with the other end portion of the insulating layer 401. The end portions of the insulating layers 401 and 403 form the step 412.

The insulating layer 401 and the insulating layer 403 can be formed of, for example, a silicon oxide film and a silicon nitride film, respectively. An insulating member 413 and an insulating member 414, which function as step buffers, are formed on side surfaces of the insulating layers forming the step 411 and the step 412. That is, the insulating member 413 is disposed on the side surface of the insulating layer 403 at the step 411. The insulating member 414 is disposed on the end portions of the insulating layers 401 and 403 forming the step 412.

Figure 3C:
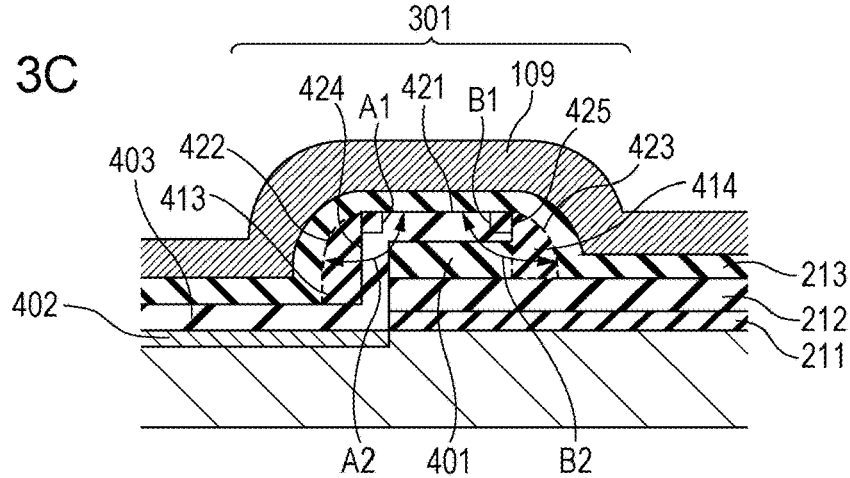
FIG. 3C is a schematic sectional view of a step portion.

As illustrated in FIG. 3C, an angle A2 formed between the upper surface 421 of the insulating layer 403 and the side surface 422 of the insulating member 413 at the upper ends of the insulating layer 403 and the insulating member 413 is larger than an angle A1 formed between the upper surface 421 and the side surface 424 of the insulating layer 403 at an upper end of the insulating layer 403. An angle B2 formed between the upper surface 421 of the insulating layer 403 and the side surface 423 of the insulating member 414 at the upper ends of the insulating layer 403 and the insulating member 414 is larger than an angle B1 formed between the upper surface 421 and the side surface 425 of the insulating layer 403 at the other upper end of the insulating layer 403. Accordingly, the insulating member 413 and the insulating member 414 function as the step buffers that buffer the steps 411 and 412 due to the insulating layers 211, 212, 401, and 403.

The side surface of the insulating member 413, which forms the angle together with the upper surface of the insulating layer 403 at the upper ends of the insulating layer 403 and the insulating member 413, is a curved surface protruding upward and is in contact with the insulating layer 213 as illustrated in FIG. 3B. Similarly, the side surface of the insulating member 414, which forms the angle together with the upper surface of the insulating layer 403 at the upper ends of the insulating layer 403 and the insulating member 414, is a curved surface protruding upward and is in contact with the insulating layer 213 as illustrated in FIG. 3B.

As illustrated in FIG. 3B, the upper surface 421 of the insulating layer 403 is illustrated by a one-dot chain line, the side surface 424 is illustrated by a two-dot chain line, the other side surface 425 is illustrated by a straight line, and the side surfaces 422 and 423 of the insulating member 413 are illustrated by dashed lines. FIG. 3C illustrates the angle A1 formed between the upper surface 421 and the side surface 424 of the insulating layer 403 at the upper end of the insulating layer 403, and the angle A2 formed between the upper surface 421 of the insulating layer 403 and the side surface 422 of the insulating member 413 at the upper ends of the insulating layer 403 and the insulating member 413. FIG. 3C also illustrates the angle B1 formed between the upper surface 421 and the side surface 425 of the insulating layer 403 at the other upper end of the insulating layer 403, and the angle B2 formed between the upper surface 421 of the insulating layer 403 and the side surface 423 of the insulating member 414 at the upper ends of the insulating layer 403 and the insulating member 414.

The light-shielding layer 109 covers the charge holding portion 102 in the pixel region and is disposed so as to be electrically connected to the silicon substrate 200 in the peripheral region. The light-shielding layer 109 covers the steps due to the end portions of the insulating layers at the step portion 301 between a portion covering the charge holding portion 102 and a portion connected to the silicon substrate 200 in a plan view. Thus, the insulating layers 211, 212, 401, 403, and 213 are disposed between the silicon substrate 200 and the light-shielding layer 109 in the section illustrated in FIG. 3B.

At the step portion 301, the insulating members 413 and 414 are disposed for the steps 411 and 412 due to the insulating layers to buffer the steps. Accordingly, the light-shielding layer 109 has an upper surface having a shape following the shape of the insulating members 413 and 414. That is, disconnection of the light-shielding layer 109 and a decrease in the film thickness thereof due to the steps 411 and 412 can be inhibited. Thus, the film thickness of a portion of the light-shielding layer 109 that overlaps the insulating layer 401 in a plan view, for example, can be less than twice the film thickness of the end portion of the insulating layer 401 and less than the film thickness of the end portion of the insulating layer 401.

The phrase "the light-shielding layer 109 has an upper surface having a shape following the shape of a member A" means that the light-shielding layer 109 has an upper surface having a shape that follows the shape of the upper surface of the member A and that is affected by the shape of the upper surface of the member A. Accordingly, in the case where a flattening film is formed on the member A and the light-shielding layer 109 is formed thereon, the light-shielding layer 109 has a flat upper surface regardless of the shape of the member A. In this case, in at least one embodiment, the light-shielding layer 109 does not have an upper surface having a shape following the shape of the member A.

FIG. 3B illustrates an example in which each light-shielding layer 109 is connected to the corresponding metal silicide region 402 of the silicon substrate 200 in an opening 415 formed in the insulating layer 403 (and the insulating layer 213) in the peripheral region. Thus, the light-shielding layer 109 is electrically connected to the silicon substrate 200. In this case, the contact portion 302 is a portion at which the metal silicide region 402 and the light-shielding layer 109 are connected to each other in the opening 415. The embodiment, however, is not limited thereto. A conductive member, which differs from the light-shielding layer 109, may be disposed in the opening 415 so as to be connected to the silicon substrate 200 (or the silicide region 402). In this case, the contact portion is a portion at which the conductive member and the silicon substrate 200 (or the silicide region 402) are in contact with each other.

With the structure illustrated in FIG. 3B, the insulating layer 213 is disposed so as to cover the insulating members 413 and 414 and the insulating layers 212 and 403 above the silicon substrate 200 above which the insulating members 413 and 414 are disposed. However, the insulating layer 213 may not be provided.

A process of forming the solid-state imaging device according to at least the first embodiment will be described with reference to FIGS. 4A to 4C, FIGS. 5A to 5C, and FIGS. 6A and 6B in the same section as FIG. 3B. FIGS. 4A to 4C, FIGS. 5A to 5C, and FIGS. 6A and 6B illustrate manufacturing processes of a part of the solid-state imaging device according to at least the first embodiment.

Separated parts are formed in the pixel region, not illustrated, of the silicon substrate 200 by, for example, shallow trench isolation (STI). Subsequently, impurities are implanted to form, for example, a charge converter, the charge holding portion, and the FD portion in the pixel region. Subsequently, gate insulating films and the gate electrodes of the transistors are formed.

Thus, the semiconductor region 121 of the photoelectric conversion element 101, the semiconductor region 122 of the charge holding portion 102, and the gate electrodes 104 to 106 and 108 of the transistors, as illustrated in FIG. 2B, are formed in the pixel region. The semiconductor regions 112 and the gate electrodes 110 of the transistors, as illustrated in FIG. 2C, are formed in the peripheral region. The process of implanting impurities may be divided into two steps performed before the formation of the gate electrodes and after the formation of the gate electrodes.

Figure 4A:
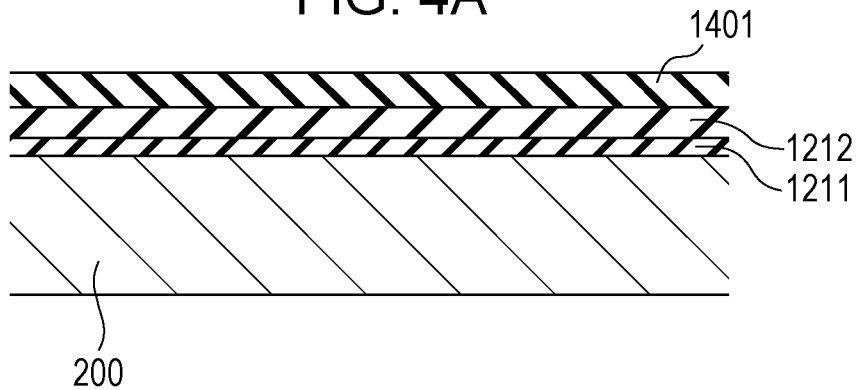
FIGS. 4A to 4C are sectional diagrams illustrating a method for manufacturing the solid-state imaging device according to at least the first embodiment.

Subsequently, as illustrated in FIG. 4A, an insulating film 1211 is formed on the silicon substrate 200, and an insulating film 1212 is formed thereon. The semiconductor region 121 of the photoelectric conversion element 101, the semiconductor region 122 of the charge holding portion 102, and the gate electrodes 104 to 108 of the transistors are formed on the silicon substrate 200 in the pixel region, not illustrated. The gate electrodes of the transistors are formed in the peripheral region. The insulating films 1211 and the 1212 function as antireflection films and can be formed, for example, in a manner in which a silicon oxide film and a silicon nitride film are accumulated.

In FIG. 4A, an insulating film 1401, which functions as a silicidation protective film that covers the pixel region when each metal silicide region 402 is formed on the silicon substrate 200 in the peripheral region, is formed on the insulating film 1212. The insulating film 1401 can be formed of, for example, the silicon oxide film 401. The insulating film 1212 can also function as an etching stop film when a contact opening in the pixel region is formed later.

Figure 4B:
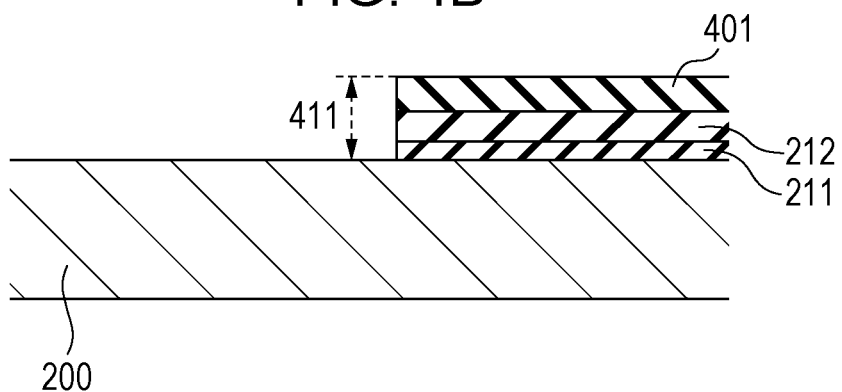
Figure 4C:
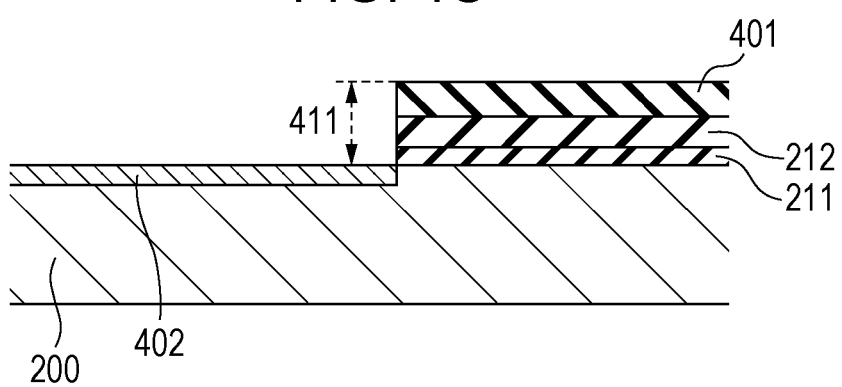

Subsequently, parts of the insulating films 1211, 1212, and 1401 are removed to form the insulating layers 211, 212, and 401 (see FIG. 4B). For example, photolithography and dry etching are performed to form patterns such that at least the insulating films 1211, 1212, and 1401 remain in the pixel region. Consequently, the step 411 due to the end portions of the insulating layers 211, 212, and 401 is formed between the charge holding portion 102 in the pixel region and the contact portion 302 in the peripheral region.

The insulating films 1211, 1212, and 1401 continue to cover the semiconductor regions 121 and 201 of the photoelectric conversion element 101 after parts thereof are removed. At this time, a part of at least one of the insulating films 1211, 1212, and 1401 may form side walls on side surfaces of the gate electrodes of the transistors in the peripheral region.

Subsequently, a multilayer film is formed of metal having a high melting point such as cobalt and a titanium nitride antioxidant film for the metal having a high melting point. Examples of the metal having a high melting point include titanium, nickel, tungsten, molybdenum, tantalum, chromium, palladium, and platinum other than cobalt. Examples of the antioxidant film for the metal having a high melting point include nickel and titanium other than titanium nitride. Subsequently, a heat treatment is performed on the multilayer film. Each metal silicide region 402 is formed on the silicon substrate 200 in at least a part of the peripheral region by the heat treatment (see FIG. 4C). Subsequently, the multilayer film including unreacted metal having a high melting point is removed.

At this time, the region of the substrate 200 covered by the insulating layers 211, 212, and 401 is not in contact with a film of the metal having a high melting point, and no metal silicide region is formed therein (except for a portion formed by diffusion of metal elements). Accordingly, the end portions of the insulating layers 211, 212, and 401 forming the step 411 substantially match the end portion of the metal silicide region 402 in a plan view.

In the example described herein, the end portions of the insulating layers 211 and 212 are aligned with the end portion of the insulating layer 401. However, the end portion of the insulating layer 401 may be nearer than the end portions of the insulating layers 211 and 212 to the contact portion 302 in the peripheral region, as described later. Also in this case, the insulating layer 401 functions as a silicidation protective film, and the metal silicide region 402 is not formed in the region of the substrate 200 covered by the insulating layer 401.

After each metal silicide region 402 is formed, an insulating film is formed on the insulating layer 401 and the metal silicide region 402 to form the insulating layer 403, which functions as an etching stop film when the contact opening in the peripheral region is formed. This insulating film can be formed of, for example, a silicon nitride film. A part of the insulating film is removed to form the insulating layer 403 in at least a part of the peripheral region.

At this time, in the case where the metal silicide region formed in the peripheral region is exposed, there is a possibility that the metal silicide region is separated and creates particles, which reduces yield. Accordingly, the insulating layer 403 is formed by etching the insulating film such that the metal silicide region 402 is not exposed and a portion that overlaps the insulating layers 211, 212, and 401 in a plan view remains. In the case where the insulating layer 403 is not used as the etching stop film, the material of the insulating layer 403 is not particularly limited.

Figure 5A:
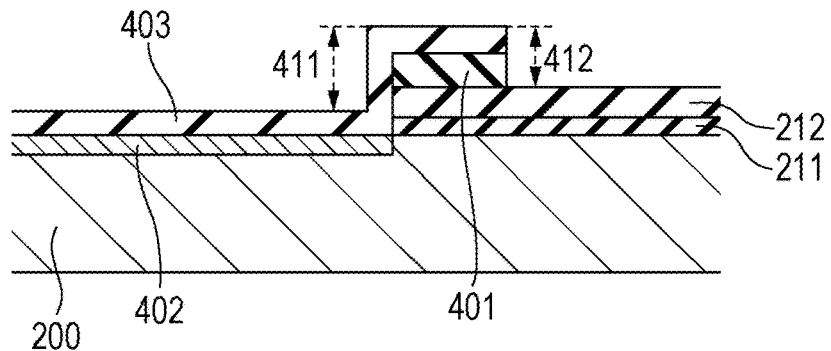
FIGS. 5A to 5C are sectional diagrams illustrating the method for manufacturing the solid-state imaging device according to at least the first embodiment.

A part of the insulating film can be removed by, for example, dry etching. At this time, the insulating layer 401 is etched in addition to the insulating film, which is to be the insulating layer 403. This forms the step 412. FIG. 5A illustrates a section in this state.

Figure 5B:
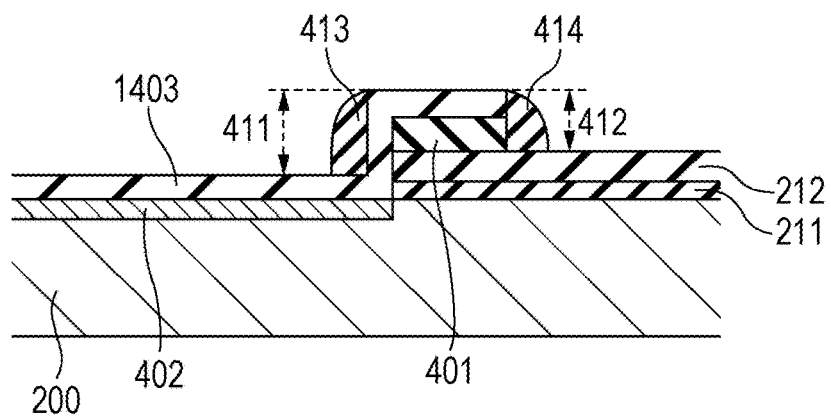
Figure 5C:
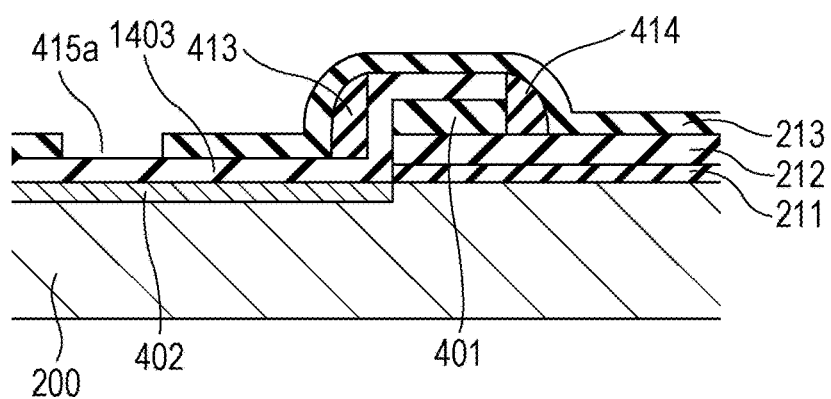

Subsequently, an insulating film is formed on the insulating layers 401 and 403 having the end portions, for example, in a manner in which a silicon oxide is accumulated, and the insulating members 413 and 414 are formed by etch back, in which dry etching is performed on the entire wafer without a mask. The insulating member 413 is formed on the side surface of the insulating layer 403 forming the step 411. The insulating member 414 is formed on the side surfaces of the end portions of the insulating layers 401 and the 403 forming the step 412. FIG. 5B illustrates a section in this state. At this time, insulating members may be formed on side surfaces of the gate electrodes in the pixel region and the peripheral region.

Subsequently, an insulating film 1213 is formed of, for example, a silicon oxide film on the insulating members 413 and 414 and the insulating layers 403 and 212. A part of the insulating film 1213 in the peripheral region is removed by, for example, etching with an insulating film 1403 used as an etching stop film to form the insulating layer 213 having an opening 415a (see FIG. 5C).

Figure 6A:
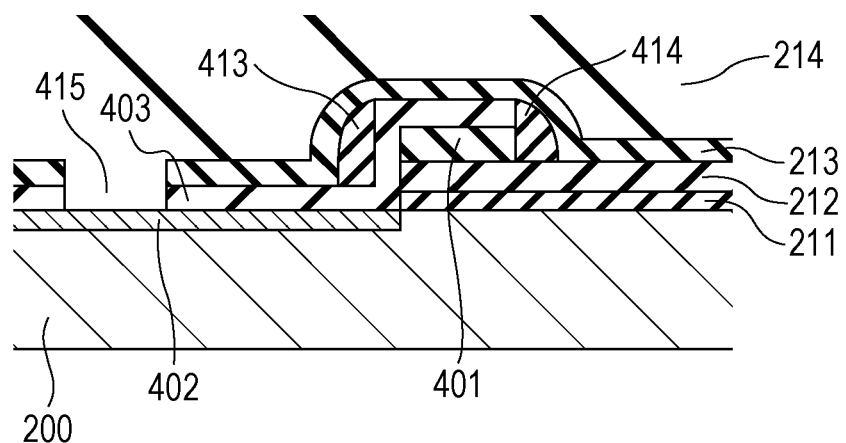
FIGS. 6A and 6B are sectional diagrams illustrating the method for manufacturing the solid-state imaging device according to at least the first embodiment.

After the opening 415a is formed, a part of the insulating film 1403 that overlaps the opening 415a in a plan view is removed by, for example, etching such that each metal silicide region 402 is exposed in the peripheral region to form the insulating layer 403 having the opening 415 (see FIG. 6A). Thus, the opening 415 is formed in peripheral region so as to overlap the metal silicide region 402 in a plan view. The insulating layer 213 functions as a close-contact layer. The shorter the distance between the silicon substrate 200 and the light-shielding layer 109, the better the light shielding. Accordingly, the film thickness of the insulating layer 213 is preferably decreased.

Figure 6B:
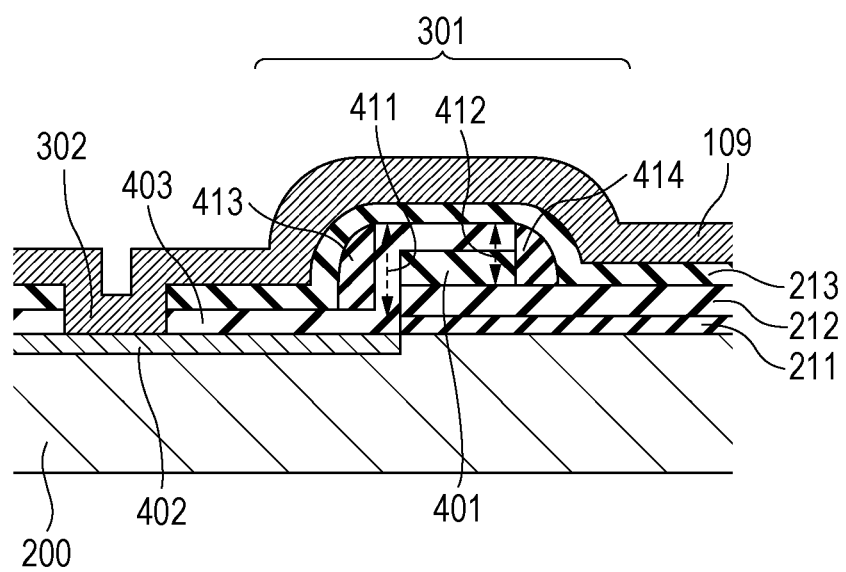

Subsequently, a conductive material, such as tungsten, is accumulated by sputtering and patterned to form the light-shielding layer 109 (see FIG. 6B). From the viewpoint of the light shielding, the distance between the upper surface of the charge holding portion 102 and the light-shielding layer 109 is preferably short, as described above. Accordingly, the insulating layer 213, which is disposed between the insulating layer 403 and the light-shielding layer 109 and between the insulating members 413 and 414 and the light-shielding layer 109, has a decreased film thickness. In the case where layers other than the insulating layer 213 are disposed between the insulating layer 403 and the light-shielding layer 109 and between the insulating members 413 and 414 and the light-shielding layer 109, the layers disposed preferably have a decreased film thickness. Accordingly, the light-shielding layer 109 has an upper surface having a shape corresponding to the shape of the insulating members 413 and 414, that is, a shape following the shape of the insulating members 413 and 414.

In the case where the insulating members 413 and 414 are not formed, there is a possibility that the light-shielding layer 109 has a decreased film thickness or is disconnected at the step 411 and the step 412, which leads to a failure of conduction. According to at least the first embodiment, a step due to an end portion of the insulating layer 211, 212, 401, or 403 is buffered in a manner in which at least one of the insulating members 413 and 414 is formed on a side surface of the end portion of the insulating layer. This inhibits a failure of conduction of the light-shielding layer 109 formed on the insulating layers 211, 212, 401, and 403 and the insulating members.

Subsequently, the interlayer insulating film 214, wiring lines, the interlayer lens, a color filter, and a micro lens, for example, are formed in a known manner. With the above structure, the solid-state imaging device, which includes the charge holding portion 102 and the light-shielding layer 109 and has a global electronic shutter function, can stably control the electric potential of the light-shielding layer 109.

One or more embodiments of the present disclosure are not limited to the above structure. For example, although, in an example described according to at least the first embodiment, a joint between the light-shielding layer 109 and the silicon substrate 200 is formed on the metal silicide region 402, the joint can be formed between the light-shielding layer and a portion of the silicon substrate 200 that does not become metal silicide. According to at least the first embodiment, an insulating member that functions as a step buffer is not formed for the step formed by the insulating layers 211 and 212, which is caused by the formation of the opening 415, because the step is small as compared to the film thickness of the light-shielding layer 109. However, an insulating member, as a step buffer, may be disposed in the opening 415. Other various modifications, improvements, and combinations can be made.

Second Embodiment

A method for manufacturing a solid-state imaging element according to at least a second embodiment will be described with reference to FIGS. 7A to 7C and FIGS. 8A to 8C. Components like to those in at least the first embodiment are designated by like reference numbers, and a description thereof is omitted or simplified.

The semiconductor region 121 of the photoelectric conversion element 101, the semiconductor region 122 of the charge holding portion 102, and the gate electrodes of the transistors are formed on the silicon substrate 200 in the pixel region, not illustrated, as in at least the first embodiment. The semiconductor regions 112 and the gate electrodes 110 of the transistors are formed in the peripheral region. Subsequently, an insulating film made of a silicon oxide film and an insulating film made of a silicon nitride film, for example, are accumulated, and parts of the insulating layers are removed by photolithography and dry etching to form the insulating layer 211 and the insulating layer 212 that function as antireflection films.

Consequently, a step 501 due to the insulating layers 211 and 212 is formed (see FIG. 7A). At this time, side walls may be formed of the insulating films, which are to be the insulating layers 211 and 212, on the side surfaces of the gate electrodes of the transistors in the peripheral region.

Subsequently, an insulating film made of, for example, a silicon oxide film is formed on the silicon substrate 200 after the insulating layers 211 and 212 are formed, and a part thereof is removed by, for example, etching to form the insulating layer 401 that functions as a silicidation protective film. Consequently, a step 502 is formed at an end portion of the insulating layer 401.

Subsequently, a heat treatment is performed on an accumulated metal having a high melting point such as cobalt to form each metal silicide region 402 on the silicon substrate 200 in at least a part of the peripheral region (see FIG. 7B). The metal silicide region 402 is not formed on a portion of the substrate 200 that is covered by the insulating layer 401 (except for a portion formed by diffusion of metal elements). Accordingly, an end portion of the insulating layer 401 substantially matches an end portion of the metal silicide region 402 in a plan view.

Subsequently, a silicon nitride film, for example, is formed on the silicon substrate 200 after the insulating layers 211, 212, and 401 are formed, and a part thereof is removed to form the insulating layer 403 that functions as an etching stop film. The insulating layer 403 is formed in at least a part of the peripheral region. At this time, a part of the insulating layer 401, in addition to the silicon nitride film, is removed by, for example, etching (see FIG. 7C). Respective portions of the insulating layers 401 and 403 are removed such that the metal silicide region 402 is not exposed, and parts of the insulating layer 401 and the insulating layer 403 are stacked. Consequently, a step 503 due to end portions of the insulating layers 401 and 403 is formed.

Subsequently, an insulating film made of, for example, a silicon oxide film is formed, and etch back, in which dry etching is performed on the entire wafer without patterning, is performed to form insulating members 511, 512, and 513. The insulating member 511 is disposed on side surfaces of end portions of the insulating layers 211 and 212. The insulating member 512 is disposed on a side surface of a portion of the insulating layer 403 forming a step 502 due to an end portion of the insulating layer 401. The insulating member 513 is disposed on side surfaces of end portions of the insulating layers 401 and 403 (see FIG. 8A). At this time, side walls may be formed of the same insulating film as in the insulating members 511, 512, and 513 on side surfaces of the gate electrodes of the transistors in the pixel region and the peripheral region.

Subsequently, an insulating film made of, for example, a silicon oxide film is formed, and a portion that overlaps the metal silicide region 402 in a plan view in the peripheral region is removed to form an opening and the insulating layer 213. At this time, the insulating layer 403 functions as an etching stop film. Subsequently, a portion of the insulating layer 403 that overlaps the opening in a plan view is removed by etching to form the opening 415 such that the metal silicide region 402 is exposed (see FIG. 8B).

Figure 8A:
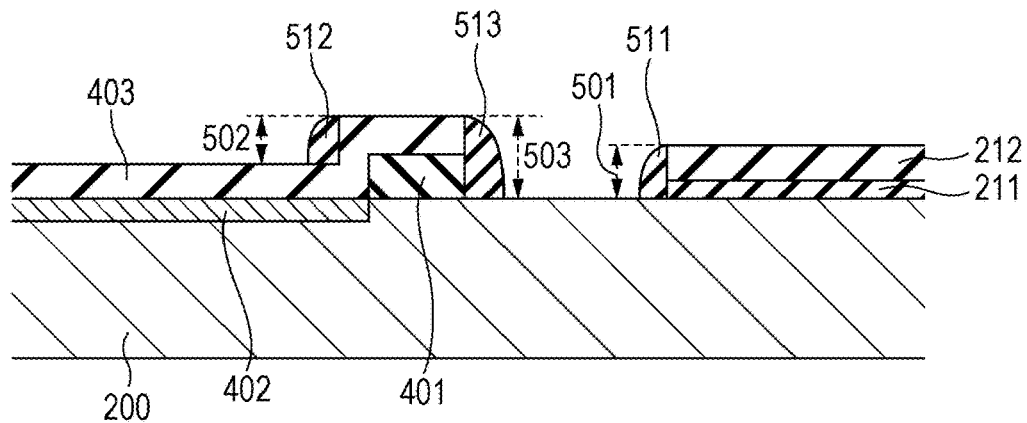
FIGS. 8A to 8C are sectional diagrams illustrating the method for manufacturing the solid-state imaging device according to at least the second embodiment.
Figure 8B:
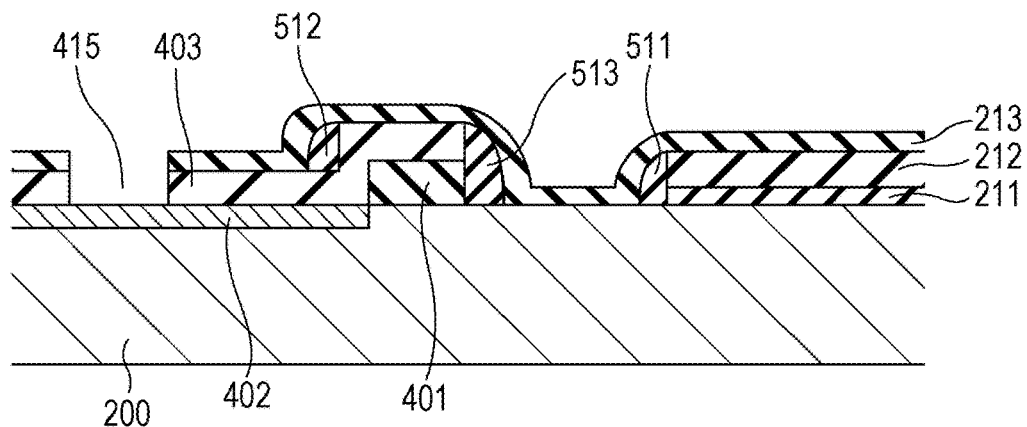
Figure 8C:
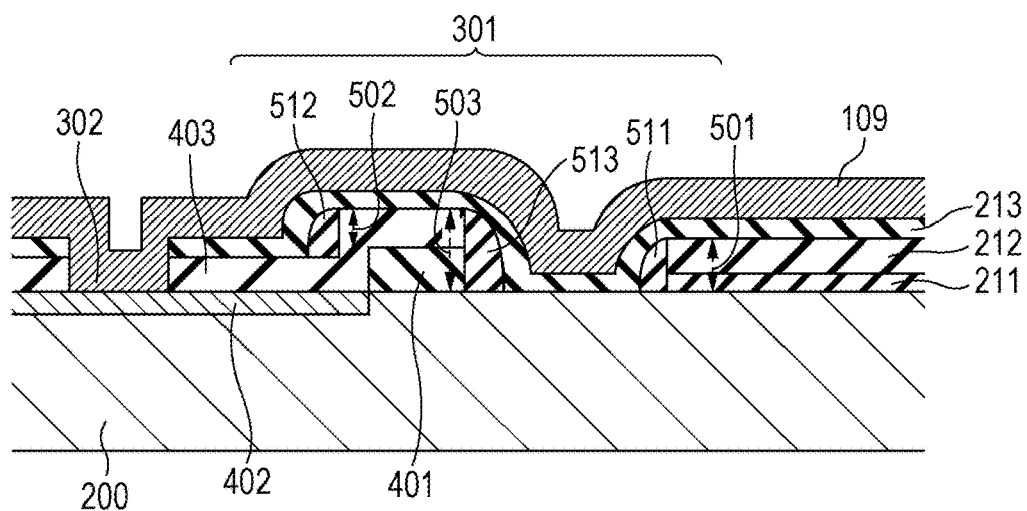

Subsequently, a film is formed of a conductive material such as tungsten by, for example, sputtering and patterned to form the light-shielding layer 109 (see FIG. 8C). A portion of the light-shielding layer 109 that is connected to the silicon substrate 200 in the opening 415 is the contact portion 302. The light-shielding layer 109 covers the charge holding portions 102, the steps 501, 502, and 503 as in at least the first embodiment and is electrically connected to the silicon substrate 200 at the contact portion 302 in the peripheral region.

Also, according to at least the second embodiment, a step due to an end portion of the insulating layer 211, 212, 401, or 403 is buffered in a manner in which at least one of the insulating members 511, 512, and 513 is formed on a side surface of the end portion of the insulating layer. This inhibits a failure of conduction of the light-shielding layer 109 formed on the insulating layers 211, 212, 401, and 403 and the insulating members.

Third Embodiment

Figure 9:
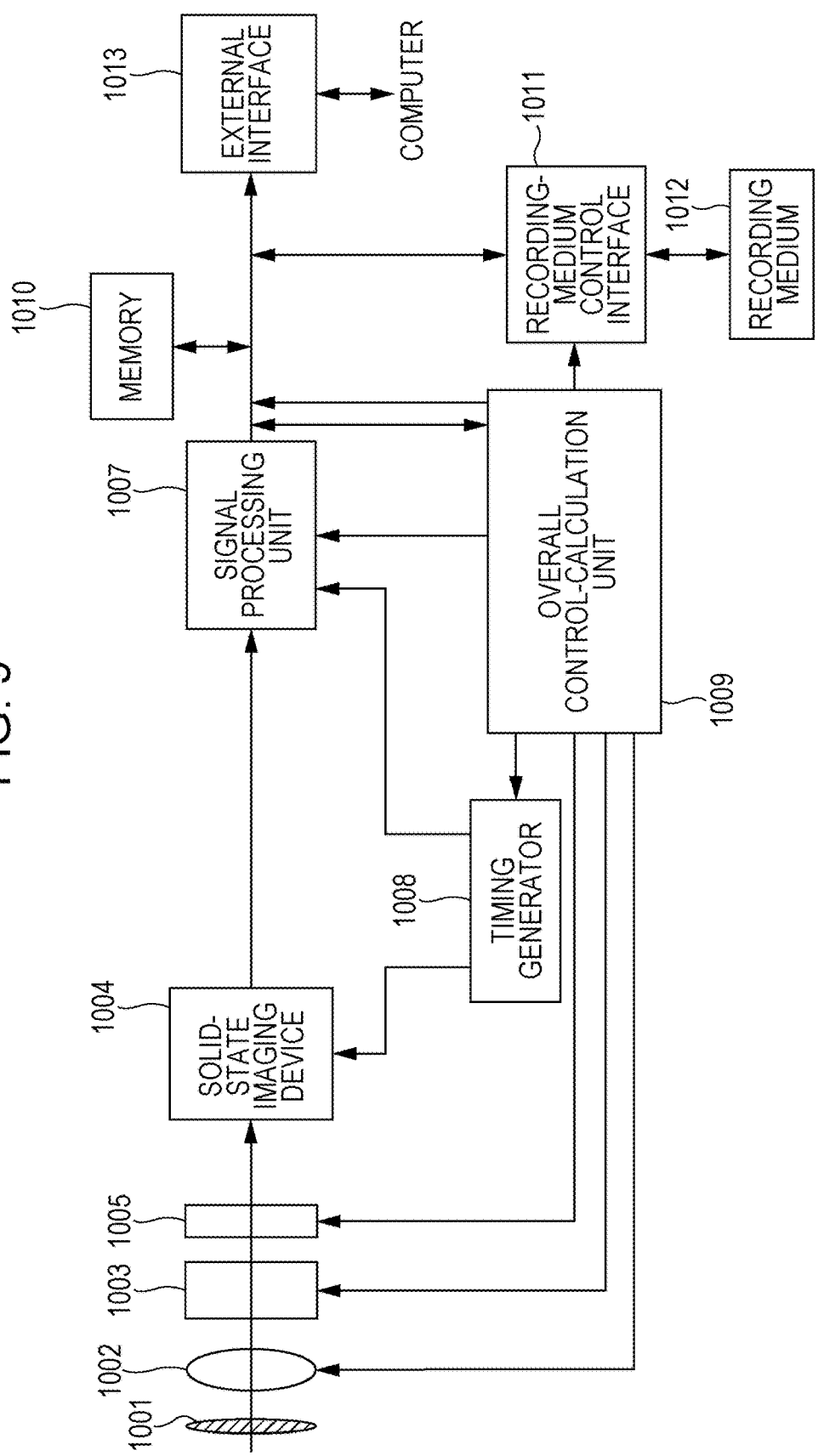
FIG. 9 illustrates an exemplary application of a solid-state imaging device according to at least a third embodiment.

An imaging system according to at least a third embodiment will be described. According to at least the third embodiment, an example of the imaging system is described as an exemplary application of the solid-state imaging devices according to at least the first and second embodiments. Examples of the imaging system include a digital still camera, a digital camcorder, a copying machine, a facsimile, a cellular phone, a vehicle-mounted camera, and an observation satellite. FIG. 9 illustrates a block diagram of a digital still camera as an example of the imaging system according to at least the third embodiment.

In FIG. 9, the imaging system includes a barrier 1001 for lens protection, a lens 1002 that focuses an optical image of an object on a solid-state imaging device 1004, a diaphragm 1003 for varying the amount of light passing through the lens 1002, and a mechanical shutter 1005. The imaging system also includes the solid-state imaging device 1004 according to at least the first or second embodiment. The solid-state imaging device 1004 converts the optical image focused by the lens 1002 into image data. The semiconductor substrate of the solid-state imaging device 1004 includes an AD converter.

The imaging system also includes a signal processing unit 1007, a timing generator 1008, an overall control-calculation unit 1009, a memory 1010, a recording-medium control interface 1011, a recording medium 1012, and an external interface 1013. The signal processing unit 1007 corrects and compresses the image data outputted from the solid-state imaging device 1004. The timing generator 1008 outputs timing signals to the solid-state imaging device 1004 and the signal processing unit 1007. The overall control-calculation unit 1009 controls the entire digital still camera. The central processing unit (CPU) can be used as the overall control-calculation unit 1009 as instance. The memory 1010 functions as a frame memory for temporarily storing the image data. The recording-medium control interface 1011 performs recording in and reading from the recording medium.

The recording medium 1012 includes a detachable semiconductor memory and performs recording and reading the image data. The external interface 1013 is an interface for communicating with, for example, an external computer. The timing signals, for example, may be inputted from the outside of the imaging system. It is only necessary for the imaging system to include at least the solid-state imaging device 1004 and the signal processing unit 1007 that processes image signals outputted from the solid-state imaging device 1004.

Other Embodiments

The embodiments described above are specific examples for carrying out one or more aspects of the present disclosure. The technical scope of the present invention is not interpreted in a limited range. That is, the present invention can be carried out as various embodiments without departing from the technical concept.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-224382 filed Nov. 17, 2016, which is hereby incorporated by reference herein in its entirety.

What is claimed is:

1. A solid-state imaging device, comprising:
   a pixel including a photoelectric conversion element and a charge holding portion to which a charge generated by the photoelectric conversion element is transferred in a pixel region;
   a peripheral circuit that processes a signal from the pixel in a peripheral region;
   a light-shielding layer that is disposed in the pixel region and the peripheral region and that is electrically connected to a substrate at a contact portion in the peripheral region;
   a first insulating layer that has a side surface between the charge holding portion and the contact portion in a plan view and that is disposed between the substrate and the light-shielding layer in a section perpendicular to a plane of the plan view; and
   a first insulating member that is disposed on the side surface of the first insulating layer,
   wherein an angle formed between an upper surface of the first insulating layer and a side surface of the first insulating member is larger than an angle formed between the upper surface of the first insulating layer and the side surface of the first insulating layer, and
   wherein a portion of the light-shielding layer that overlaps the first insulating member in the plan view has an upper surface having a shape following a shape of the first insulating member.

2. The solid-state imaging device according to claim 1, wherein a second insulating layer is disposed between the substrate and the first insulating layer in the section.

3. The solid-state imaging device according to claim 2, wherein the second insulating layer has an end portion between the substrate and the first insulating layer in the section,
   wherein the first insulating layer covers the end portion of the second insulating layer and has a step due to the end portion of the second insulating layer, and
   wherein a second insulating member is disposed on a side surface of the first insulating layer at the step.

4. The solid-state imaging device according to claim 3, wherein the second insulating layer has another end portion that is aligned with an end portion of the first insulating layer in the section, and
   wherein the first insulating member is disposed on the side surface of the end portion of the first insulating layer and a side surface of the other end portion of the second insulating layer.

5. The solid-state imaging device according to claim 4, wherein a third insulating layer is disposed between the substrate and the second insulating layer in the section,
   wherein the third insulating layer has an end portion that is aligned with the other end portion of the second insulating layer, and
   wherein the third insulating layer covers the charge holding portion in the plan view.

6. The solid-state imaging device according to claim 1, wherein the first insulating layer has, in the peripheral region, an opening for electrically connecting the light-shielding layer to the substrate.

7. The solid-state imaging device according to claim 1, wherein the light-shielding layer is electrically connected to the substrate in a state where a silicide region formed on the substrate is interposed therebetween.

8. The solid-state imaging device according to claim 1, wherein a film thickness of a portion of the light-shielding layer that overlaps the first insulating layer in the plan view is less than twice a film thickness of an end portion of the first insulating layer.

9. The solid-state imaging device according to claim 1, wherein a film thickness of a portion of the light-shielding layer that overlaps the first insulating layer in the plan view is less than a film thickness of an end portion of the first insulating layer.

10. An imaging system, comprising:
    the solid-state imaging device according to claim 1; and
    a signal processing unit that processes a signal that the solid-state imaging device outputs.

11. A solid-state imaging device, comprising:
    a pixel region containing a pixel including a photoelectric conversion element and a charge holding portion to which a charge generated by the photoelectric conversion element is transferred;
    a peripheral region in which a peripheral circuit that processes a signal from the pixel is disposed;

a light-shielding layer that is disposed in the pixel region and the peripheral region and that is electrically connected to a substrate at a contact portion in the peripheral region;

a first insulating layer that has an end portion between the charge holding portion and the contact portion in a plan view and that is disposed between the substrate and the light-shielding layer in a section perpendicular to a plane of the plan view; and a first insulating member that is disposed on a side surface of the end portion of the first insulating layer and that buffers a step due to the end portion, wherein a portion of the light-shielding layer that overlaps the first insulating member in the plan view has an upper surface having a shape following a shape of the first insulating member.

12. The solid-state imaging device according to claim 11, wherein a second insulating layer is disposed between the substrate and the first insulating layer in the section.

13. The solid-state imaging device according to claim 12, wherein the second insulating layer has an end portion between the substrate and the first insulating layer in the section, wherein the first insulating layer covers the end portion of the second insulating layer and has a step due to the end portion of the second insulating layer, and wherein a second insulating member is disposed on a side surface of the first insulating layer at the step.

14. The solid-state imaging device according to claim 13, wherein the second insulating layer has another end portion that is aligned with the end portion of the first insulating layer in the section, and wherein the first insulating member is disposed on the side surface of the end portion of the first insulating layer and a side surface of the other end portion of the second insulating layer.

15. The solid-state imaging device according to claim 14, wherein a third insulating layer is disposed between the substrate and the second insulating layer in the section, wherein the third insulating layer has an end portion that is aligned with the other end portion of the second insulating layer, and wherein the third insulating layer covers the charge holding portion in the plan view.

16. The solid-state imaging device according to claim 11, wherein the first insulating layer has, in the peripheral region, an opening for electrically connecting the light-shielding layer to the substrate.

17. The solid-state imaging device according to claim 11, wherein the light-shielding layer is electrically connected to the substrate in a state where a silicide region formed on the substrate is interposed therebetween.

18. An imaging system, comprising:
the solid-state imaging device according to claim 11; and
a signal processing unit that processes a signal that the solid-state imaging device outputs.

19. A method for manufacturing a solid-state imaging device, the method comprising:
forming a first insulating film on a substrate having a pixel region containing a semiconductor region of a photoelectric conversion element, a semiconductor region of a charge holding portion, and a gate electrode of a transistor and a peripheral region containing a gate electrode of a transistor;

removing a part of the first insulating film to form a first insulating layer;

forming, on a side surface of an end portion of the first insulating layer that is formed by removing the part of the first insulating film, an insulating member that buffers a step due to the end portion; and forming a light-shielding layer that covers the semiconductor region of the charge holding portion, the end portion of the first insulating layer, and the insulating member and that is to be electrically connected to the substrate in the peripheral region, wherein a portion of the light-shielding layer that overlaps the insulating member in a plan view has an upper surface having a shape following a shape of the insulating member.

20. The method for manufacturing the solid-state imaging device according to claim 19,
wherein an opening is formed in the first insulating layer in the peripheral region before the light-shielding layer is formed, and wherein the light-shielding layer is electrically connected to the substrate in the opening.

* * * * *